US007254085B2

(12) United States Patent
Hirabayashi

(10) Patent No.: US 7,254,085 B2
(45) Date of Patent: Aug. 7, 2007

(54) STATIC RANDOM ACCESS MEMORY DEVICE AND METHOD OF REDUCING STANDBY CURRENT

(75) Inventor: Osamu Hirabayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 80 days.

(21) Appl. No.: 11/219,827

(22) Filed: Sep. 7, 2005

(65) Prior Publication Data

US 2006/0268628 A1     Nov. 30, 2006

(30) Foreign Application Priority Data

May 25, 2005   (JP) .............................. 2005-152437

(51) Int. Cl.
*G11C 5/14* (2006.01)
(52) U.S. Cl. ................. 365/229; 365/154; 365/189.09; 365/228
(58) Field of Classification Search ................ 365/154, 365/189.09, 226, 228, 229
See application file for complete search history.

(56) References Cited

U.S. PATENT DOCUMENTS 5,726,562 A * 3/1998 Mizuno ....................... 323/312
6,999,338 B1 * 2/2006 Hirabayashi ................. 365/154
7,061,820 B2 * 6/2006 Deng ........................... 365/227

OTHER PUBLICATIONS

Masanao Yamaoka, et al., "A 300MHz 25 μA/Mb Leakage On-Chip SRAM Module Featuring Process-Variation Immunity and Low-Leakage-Active Mode for Mobile-Phone Application Processor", 2004 IEEE International Solid-State Circuits Conference.
U.S. Appl. No. 11/401,933 filed Apr. 12, 2006, Hirabayashi.

* cited by examiner

*Primary Examiner*—VanThu Nguyen
(74) *Attorney, Agent, or Firm*—Oblon, Spivak, McClelland, Maier & Neustadt, P.C.

(57) ABSTRACT

A semiconductor storage device includes first and second additional FETs disposed in parallel on one of potential lines for supplying first and second drive potentials to each SRAM memory cell. The gate terminal of the first additional FET is supplied with a selection signal through a selection signal supply line to turn on the first additional FET, when the memory cell is selected. The gate terminal of the second additional FET is supplied with a bias potential through a bias supply line, wherein the bias potential has first and second levels respectively corresponding to non-selection and selection of the memory cell.

19 Claims, 7 Drawing Sheets

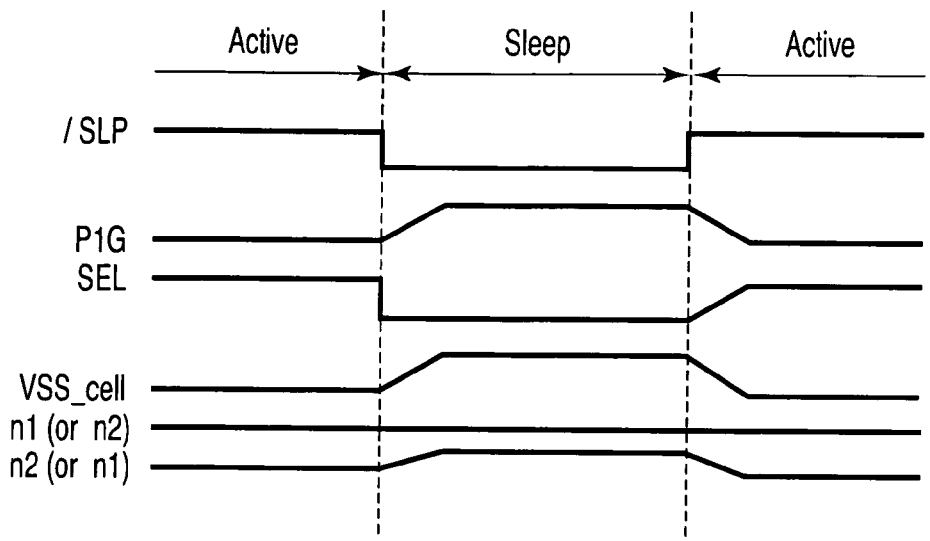
F I G. 12
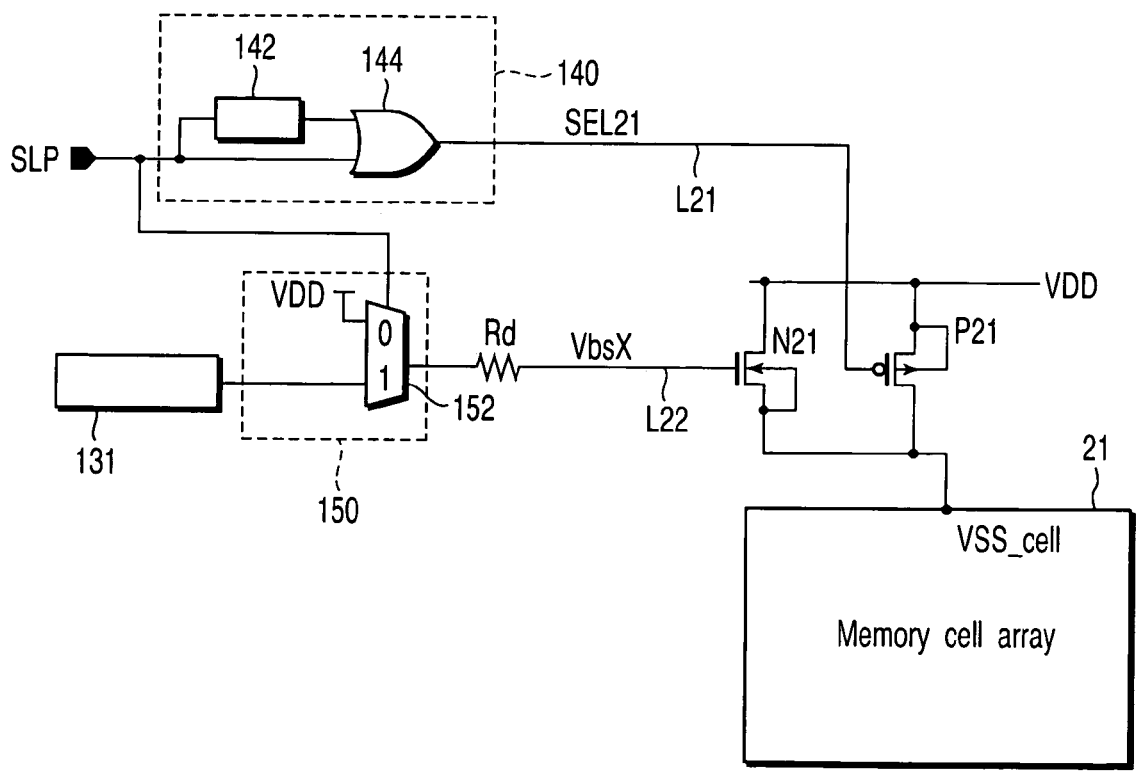
F I G. 13

STATIC RANDOM ACCESS MEMORY DEVICE AND METHOD OF REDUCING STANDBY CURRENT

CROSS-REFERENCE TO RELATED APPLICATIONS

This application is based upon and claims the benefit of priority from prior Japanese Patent Application No. 2005-152437, filed May 25, 2005, the entire contents of which are incorporated herein by reference.

BACKGROUND OF THE INVENTION

1. Field of the Invention

The present invention relates to a semiconductor storage device, and particularly to a technique for reducing standby current in a static semiconductor storage device, e.g., an SRAM (SRAM: Static Random Access Memory).

2. Description of the Related Art

SRAMs (typically, each memory cell includes six transistors to store one bit) are widely used for LSIs (LSI: Large Scale Integrated circuit). As regards SRAMs, a problem has become prominent in that leakage current increases in memory cells on standby, as a consequence of the reduced size and operation voltage of LSIs. The term "standby" means that a memory cell is in the non-selected state.

The thickness of the gate oxide film of MOSFETs (MOSFET: Metal-Oxide-Semiconductor Field-Effect Transistor) used in SRAMs is gradually decreasing, as LSIs are becoming more miniaturized and more highly integrated. As a consequence, the leakage current tunneling through the gate oxide film (gate leakage) increases and thereby brings about an increase in the total leakage current on standby. In addition, the threshold voltage of MOSFETs decreases along with decrease in the operation voltage of LSIs, which brings about an increase in the leakage current in the OFF-state (sub-threshold leakage).

As a countermeasure for reducing the standby leakage in SRAMs, there is a method of controlling the electric potential of a cell array on standby to relax an electric field applied to MOSFETs, in view of circuitry (for example, Masanao Yamaoka et al., "A 300 MHz 25 µA/Mb Leakage On-Chip SRAM Module . . . ", ISSCC 2004/ SESSION 27/ SRAM/ 27.2, pp. 494-495). Further, as a related application filed by the same inventor, which has not yet been published, there is U.S. patent application Ser. No. 11/013,429, filed Dec. 17, 2004.

BRIEF SUMMARY OF THE INVENTION

According to a first aspect of the present invention, there is provided a semiconductor storage device comprising: a memory cell array including a plurality of memory cells arrayed therein; a plurality of word lines configured to select the memory cells; a plurality of data lines configured to transmit data into and from the memory cells; a first potential line configured to supply a first drive potential to each of the memory cells; a second potential line configured to supply a second drive potential lower than the first drive potential to each of the memory cells; a first additional FET (FET: Field-Effect Transistor) disposed on one potential line of the first and second potential lines, to selectively bring the one potential line into conduction; a selection signal supply line configured to supply a selection signal to a gate terminal of the first additional FET, so as to set the first additional FET in an ON-state, when each of the memory cells is selected; a second additional FET disposed on the one potential line, in parallel with the first additional FET, to selectively bring the one potential line into conduction; and a bias supply line configured to supply a gate terminal of the second additional FET with a bias potential that has first and second levels respectively corresponding to non-selection and selection of each of the memory cells, wherein the second additional FET is turned on, with reference to the bias potential, by a voltage drop generated in the memory cell, and wherein the first level of the bias potential is a potential between the first and second drive potentials, and the second level of the bias potential is closer to one potential of the first and second drive potentials corresponding to the one potential line, than the first level is.

According to a second aspect of the present invention, there is provided a semiconductor storage device comprising: a memory cell array including a plurality of memory cells arrayed therein, each of the memory cells having first to fourth NMISFETs (MIS: Metal-Insulator-Semiconductor) and first and second PMISFETs, such that a drain terminal of the first NMISFET is connected to a drain terminal of the first PMISFET, a drain terminal of the second NMISFET is connected to a drain terminal of the second PMISFET, gate terminals of the first NMISFET and the first PMISFET are connected to the drain terminals of the second NMISFET and the second PMISFET and a source terminal of the third NMISFET, and gate terminals of the second NMISFET and the second PMISFET are connected to the drain terminals of the first NMISFET and the first PMISFET and a source terminal of the fourth NMISFET; a plurality of word lines configured to select the memory cells, each of the word lines being connected to gate terminals of the third NMISFET and the fourth NMISFET; a plurality of data lines configured to transmit data into and from the memory cells, two of the data lines being respectively connected to drain terminals of the third NMISFET and the fourth NMISFET; a first potential line connecting source terminals of the first PMISFET and the second PMISFET to a supply source of a first drive potential; a second potential line connecting source terminals of the first NMISFET and the second NMISFET to a supply source of a second drive potential lower than the first drive potential; a fifth NMISFET disposed on the second potential line to selectively bring the second potential line into conduction; a selection signal supply line configured to supply a selection signal to a gate terminal of the fifth NMISFET, so as to set the fifth NMISFET in an ON-state, when each of the memory cells is selected; a third PMISFET disposed on the second potential line, in parallel with the fifth NMISFET, to selectively bring the second potential line into conduction; a bias supply line configured to supply a gate terminal of the third PMISFET with a bias potential that has first and second levels respectively corresponding to non-selection and selection of each of the memory cells, wherein the first level of the bias potential is a potential between the first and second drive potentials, and the second level of the bias potential is the second drive potential; a selection circuit configured to be driven by a mode-switching signal that switches non-selection and selection of each of the memory cells, so as to selectively supply the bias supply line with the first and second levels of the bias potential; and a bias generation circuit configured to generate the first level of the bias potential and supply the first level to one input of the selection circuit.

According to a third aspect of the present invention, there is provided a semiconductor storage device comprising: a memory cell array including a plurality of memory cells arrayed therein, each of the memory cells having first to fourth NMISFETs (MIS: Metal-Insulator-Semiconductor) and first and second PMISFETs, such that a drain terminal of the first NMISFET is connected to a drain terminal of the first PMISFET, a drain terminal of the second NMISFET is connected to a drain terminal of the second PMISFET, gate terminals of the first NMISFET and the first PMISFET are connected to the drain terminals of the second NMISFET and the second PMISFET and a source terminal of the third NMISFET, and gate terminals of the second NMISFET and the second PMISFET are connected to the drain terminals of the first NMISFET and the first PMISFET and a source terminal of the fourth NMISFET; a plurality of word lines configured to select the memory cells, each of the word lines being connected to gate terminals of the third NMISFET and the fourth NMISFET; a plurality of data lines configured to transmit data into and from the memory cells, two of the data lines being respectively connected to drain terminals of the third NMISFET and the fourth NMISFET; a first potential line connecting source terminals of the first PMISFET and the second PMISFET to a supply source of a first drive potential; a second potential line connecting source terminals of the first NMISFET and the second NMISFET to a supply source of a second drive potential lower than the first drive potential; a third PMISFET disposed on the first potential line to selectively bring the first potential line into conduction; a selection signal supply line configured to supply a selection signal to a gate terminal of the third PMISFET, so as to set the third PMISFET in an ON-state, when each of the memory cells is selected; a fifth NMISFET disposed on the first potential line, in parallel with the third PMISFET, to selectively bring the first potential line into conduction; a bias supply line configured to supply a gate terminal of the fifth NMISFET with a bias potential that has first and second levels respectively corresponding to non-selection and selection of each of the memory cells, wherein the first level of the bias potential is a potential between the first and second drive potentials, and the second level of the bias potential is the first drive potential; a selection circuit configured to be driven by a mode-switching signal that switches non-selection and selection of each of the memory cells, so as to selectively supply the bias supply line with the first and second levels of the bias potential; and a bias generation circuit configured to generate the first level of the bias potential and supply the first level to one input of the selection circuit.

BRIEF DESCRIPTION OF THE SEVERAL VIEWS OF THE DRAWING

FIG. 12 is a view showing signal waveforms in the device shown in FIG. 11; and

FIG. 13 is a view showing an SRAM (semiconductor storage device) according to a fourth embodiment of the present invention, focusing on circuitry for clamping the standby voltage thereof.

DETAILED DESCRIPTION OF THE INVENTION

In the process of developing the present invention, the inventor studied countermeasures in view of circuitry for reducing standby leakage in SRAMs. As a result, the inventor has arrived at the findings given below.

Figure 1:
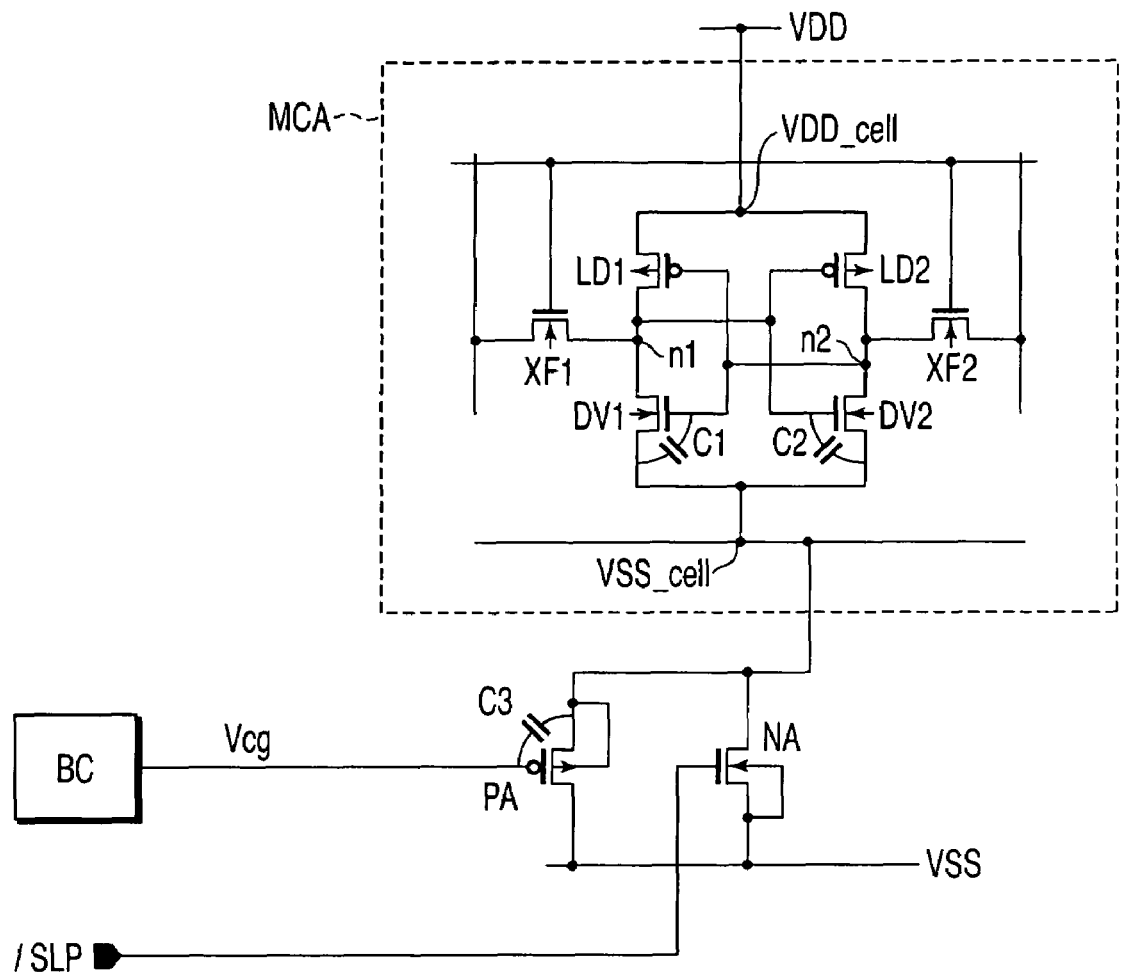
FIG. 1 is a view showing a countermeasure in view of circuitry for reducing standby leakage in an SRAM, which has been proposed by the inventor in the process of developing the present invention.

FIG. 1 is a view showing a countermeasure in view of circuitry for reducing standby leakage in an SRAM, which has been proposed by the inventor in the process of developing the present invention (U.S. patent application Ser. No. 11/013,429). The SRAM includes a memory cell array MCA, in which a plurality of memory cells are arrayed in a matrix format. However, FIG. 1 shows only one memory cell in an enlarged view, for the sake of convenience.

As shown in FIG. 1, each memory cell includes six transistors, i.e., two driver transistors DV1 and DV2, two load transistors LD1 and LD2, and two transfer gate transistors XF1 and XF2. The transistors DV1, DV2, XF1, and XF2 are formed of N- (N-channel type) MOSFETs, while the transistors LD1 and LD2 are formed of P- (P-channel type) MOSFETs. The driver transistors DV1 and DV2 and load transistors LD1 and LD2 are connected to form a cross-feedback circuit.

When the memory cell is selected, the source potential (higher potential) VDD_cell of the transistors LD1 and LD2, and the source potential (lower potential) VSS_cell of the transistors DV1 and DV2 are set to be a power supply potential VDD and a ground potential VSS, respectively. In the case of an ordinary SRAM provided with no countermeasure in view of circuitry for reducing standby leakage, the potential VDD_cell and potential VSS_cell are maintained at the power supply potential VDD and ground potential VSS, respectively, even when it is on standby. However, in the case of the device shown in FIG. 1, the level of the lower potential VSS_cell (or it may be the level of the higher potential VDD_cell) is controlled to reduce the standby leakage, when it is on standby.

More specifically, a potential line connecting a node on the lower potential VSS_cell side to a VSS potential source is provided with a first additional transistor (NMOSFET) NA and a second additional transistor (PMOSFET) PA disposed thereon in parallel for selectively bringing the line into conduction. The additional transistor NA is supplied with a mode-switching signal /SLP on its gate terminal, such that it is set in the ON-state when the memory cell is selected (active mode), and it is set in the OFF-state when the memory cell is non-selected (sleep mode). The other additional transistor PA is supplied with a bias potential Vcg on its gate terminal from a bias circuit BC. The bias potential Vcg is set such that the transistors PA is turned on, with reference to the bias potential Vcg, by a voltage drop generated in the corresponding memory cell when the transistor NA is set in the OFF-state.

Figure 2:
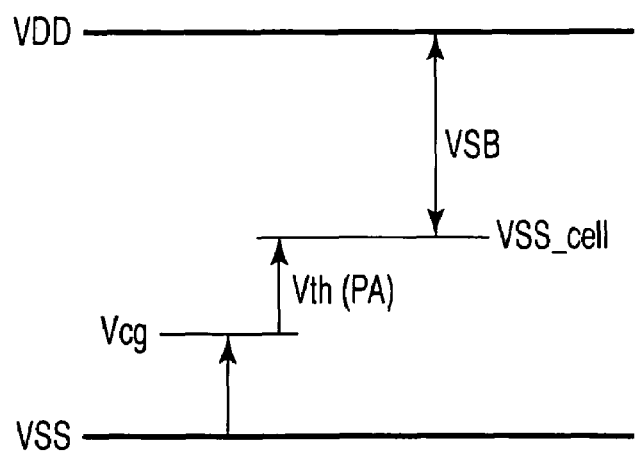
FIG. 2 is a view showing the potential relationship within a memory cell on standby in the device shown in FIG. 1.

FIG. 2 is a view showing the potential relationship within a memory cell on standby in the device shown in FIG. 1. When the memory cell is selected, the ground potential VSS is applied to the node on the lower potential VSS_cell side, through the transistor NA set in the ON-state. On the other hand, when the memory cell is non-selected and the transistor NA is set in the OFF-state, the level of the node on the lower potential VSS_cell gradually increases from VSS due to leakage. When the lower potential VSS_cell increases and exceeds the sum of bias potential Vcg and the threshold voltage Vth(PA) of the transistor PA, the transistor PA is turned on. As a consequence, the voltage (standby voltage VSB) applied to the memory cell on standby is clamped by this tuned-on transistor PA.

In the device shown in FIG. 1, however, during a mode transition (when a memory cell is in a transition from selection to non-selection or a transition from non-selection to selection), the data stored in the memory cell may be affected by noises. This problem will be explained with reference to FIG. 3, which is a view showing signal waveforms in the device shown in FIG. 1.

Figure 3:
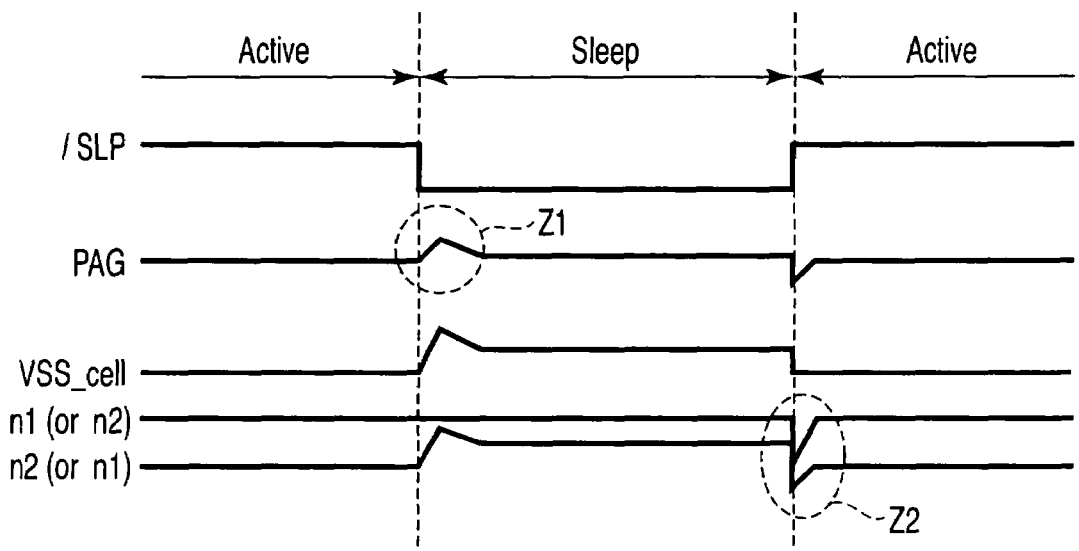
FIG. 3 is a view showing signal waveforms in the device shown in FIG. 1.

When the memory cell is in a transition from selection (active mode) to non-selection (sleep mode), as shown in FIG. 3, a mode-switching signal /SLP is changed from H-level to L-level to set the transistor NA in the OFF-state, and the level of lower potential VSS_cell is thereby increased due to a voltage drop generated in the memory cell. At this time, as indicted by a portion Z1 in FIG. 3, the potential on the gate PAG of the PMOS transistor for clamping is slightly raised from the original bias potential Vcg by capacitive coupling due to a parasitic capacitance (C3) of the transistor PA. Since the potential on the gate PAG becomes higher than the bias potential Vcg, the clamp level for the lower potential VSS_cell also becomes higher. As a consequence, the voltage (standby voltage VSB) applied to the memory cell is temporarily lowered, which may destroy the stored data.

On the other hand, when the memory cell is in a transition from non-selection (sleep mode) to selection (active mode), as shown in FIG. 3, the mode-switching signal /SLP is changed from L-level to H-level to set the transistor NA in the ON-state, and the level of lower potential VSS_cell is thereby discharged to the ground potential VSS. At this time, as indicted by a portion Z2 in FIG. 3, internal nodes n1 and n2 of the memory cell receive coupling noises due to parasitic capacitances (C1 and C2) of NMOS transistors DV1 and DV2 that form part of the cell. As a consequence, the cell data may be inverted by the coupling noises.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

FIRST EMBODIMENT

Figure 4:
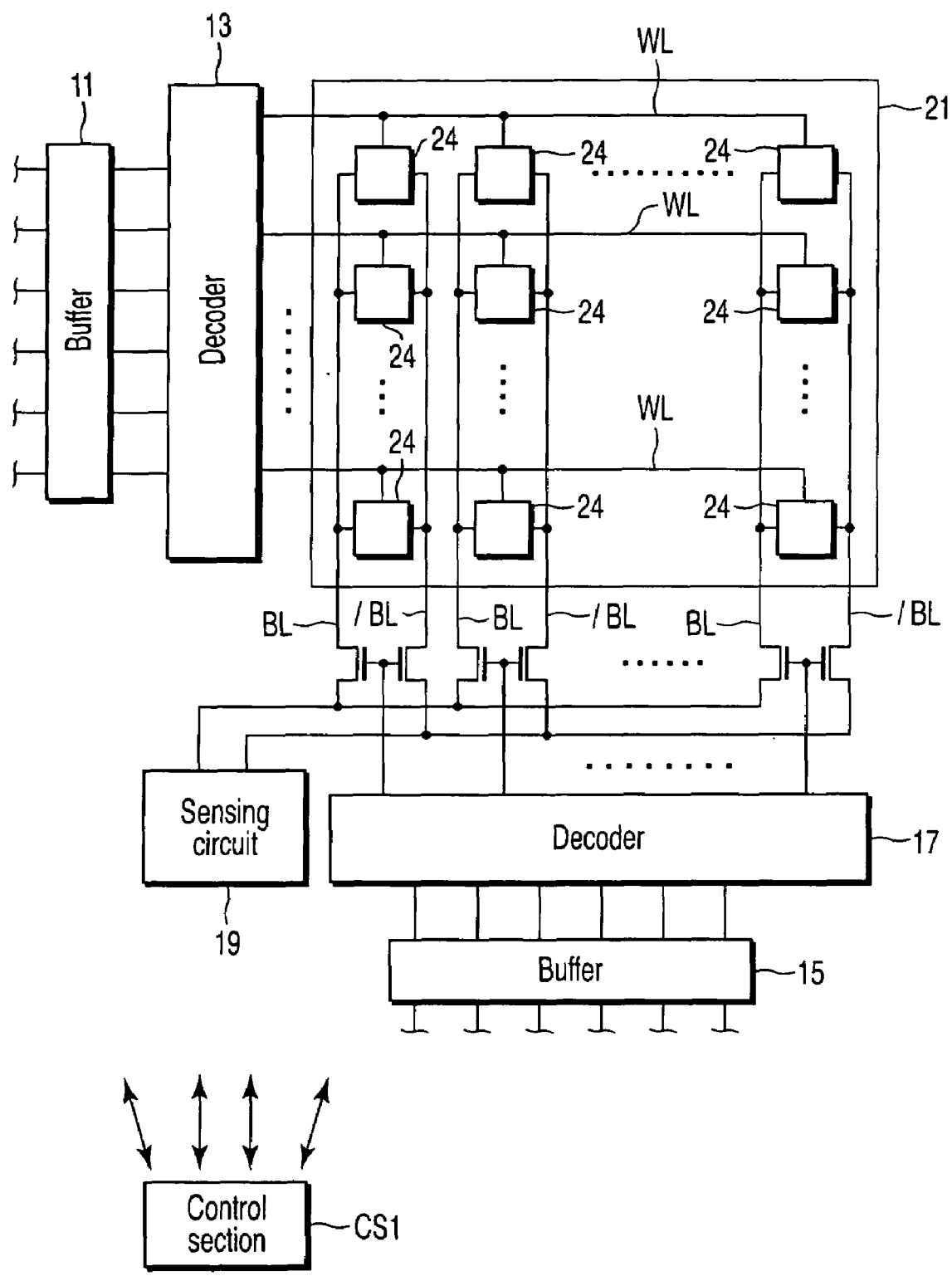
FIG. 4 is a block diagram showing an SRAM (semiconductor storage device) according to a first embodiment of the present invention.

FIG. 4 is a block diagram showing an SRAM (semiconductor storage device) according to a first embodiment of the present invention. The SRAM includes a memory cell array 21, in which memory cells 24 are respectively disposed at addresses arrayed in a matrix format. Word lines WL for selecting the memory cells are respectively connected to the rows of the memory cell array 21. Complementary pairs of data lines BL and /BL for transmitting data to and from the memory cells are respectively connected to the columns of the memory cell array 21.

A row address buffer 11 and a row decoder 13 are disposed to select the word lines WL. A column address buffer 15 and a column decoder 17 are disposed to select the data lines BL and /BL. A sensing circuit 19 is connected to the data lines BL and /BL, for reading stored data. The row address buffer 11 and column address buffer 12 are connected to a control section CS1 for generating address signals, data signals, and so forth. The control section CS1 is disposed on a substrate common to the memory cell array 21, or is formed as a device separate from the memory cell array 21.

Figure 5:
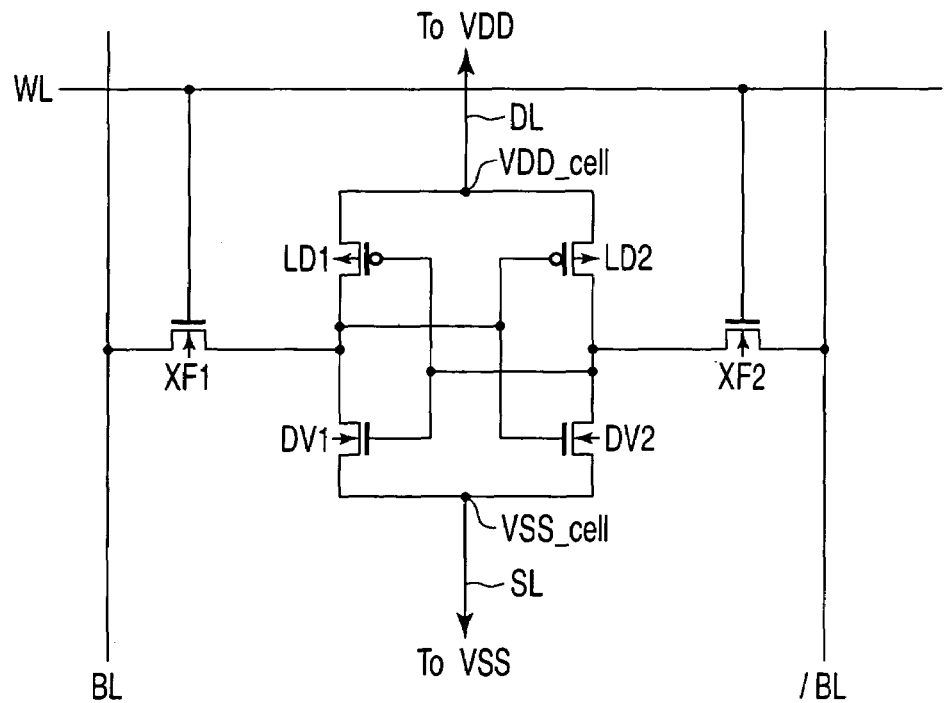
FIG. 5 is an enlarged view showing one memory cell in the memory cell array shown in FIG. 4.

FIG. 5 is an enlarged view showing one memory cell 24 in the memory cell array 21 shown in FIG. 4. As shown in FIG. 5, each memory cell includes six transistors, i.e., two driver transistors DV1 and DV2, two load transistors LD1 and LD2, and two transfer gate transistors XF1 and XF2. The transistors DV1, DV2, XF1, and XF2 are formed of NMIS- (MIS: Metal-Insulator-Semiconductor) FETs, and typically formed of NMOSFETs. The transistors LD1 and LD2 are formed of PMISFETs, and typically formed of PMOSFETs.

The driver transistors DV1 and DV2 and load transistors LD1 and LD2 are connected to form a cross-feedback circuit. Specifically, the drain terminals of the transistors DV1 and LD1 are connected to each other. The drain terminals of the transistors DV2 and LD2 are connected to each other. The gate terminals of the transistors DV1 and LD1 are connected to the drain terminals of the transistors DV2 and LD2 and the source terminal of the transfer gate transistor XF2. The gate terminals of the transistors DV2 and LD2 are connected to the drain terminals of the transistors DV1 and LD1 and the source terminal of the transfer gate transistor XF1.

Each of the word lines WL is connected to the gate terminals of the transistors XF1 and XF2. Each of the complementary pairs of data lines BL and /BL are respectively connected to the drain terminals of the transistors XF1 and XF2. The source terminals of the transistors LD1 and LD2 are connected to a supply source of a power supply potential (a first drive potential) VDD through a potential line DL. The source terminals of the transistors DV1 and DV2 are connected to a supply source of a ground potential (a second drive potential lower than the first drive potential) VSS through a potential line SL.

Figure 6:
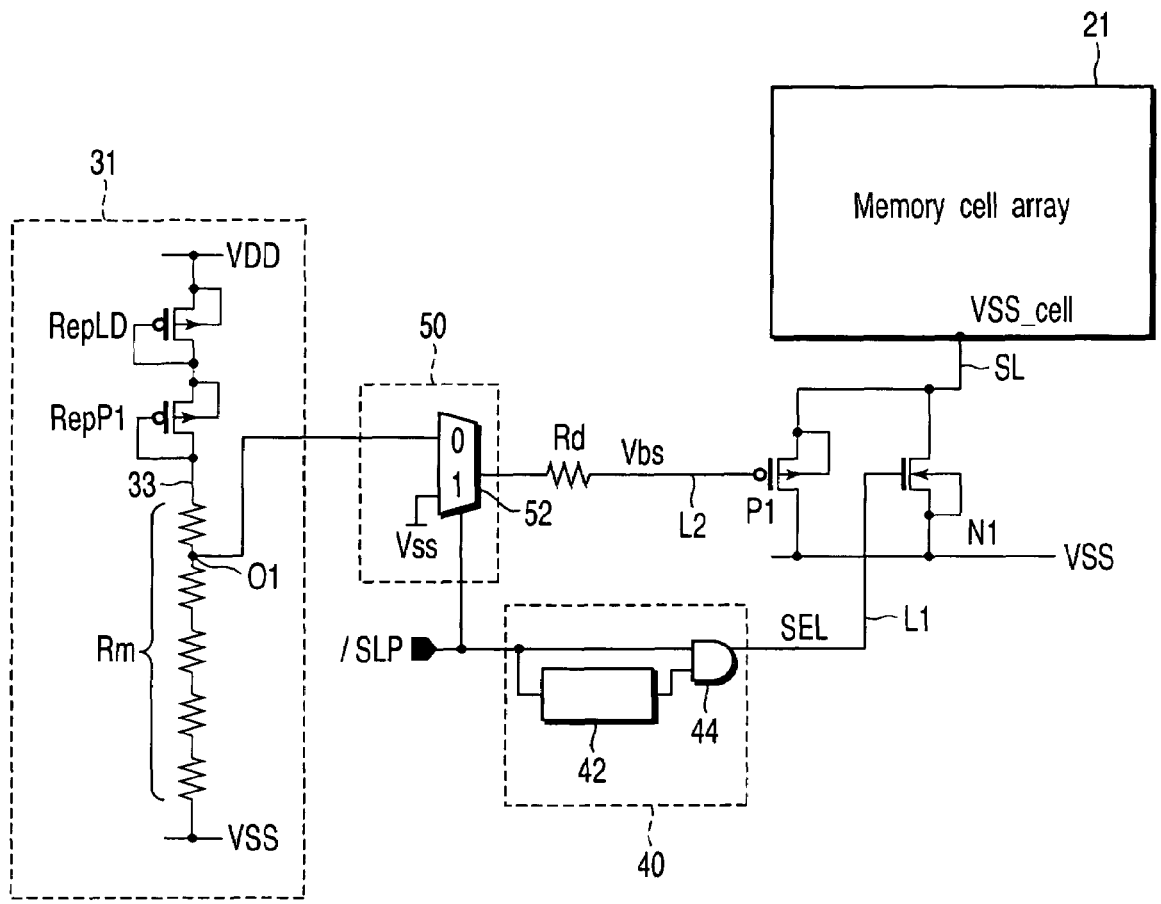
FIG. 6 is a view showing the SRAM (semiconductor storage device) according to the first embodiment, focusing on circuitry for clamping the standby voltage thereof.

FIG. 6 is a view showing the SRAM (semiconductor storage device) according to the first embodiment, focusing on circuitry for clamping the standby voltage thereof. As shown in FIG. 6, the potential line SL connected to the ground potential VSS is provided with a first additional transistor N1 disposed thereon for selectively bringing the potential line SL into conduction. The transistor N1 is formed of an NMISFET, and typically an NMOSFET. The gate terminal of the transistor N1 is supplied with a selection signal SEL through a selection signal supply line L1 to set the transistor N1 in the ON-state when the memory cell is selected. Specifically, in summary, the transistor N1 is set in the ON-state when the memory cell is selected, and it is set in the OFF-state when the memory cell is non-selected. When the memory cell is selected, the ground potential VSS is applied to the node on the lower potential VSS_cell side, through the transistor N1 set in the ON-state.

The selection signal supply line L1 is provided with a delay circuit 40 including a delay device 42 and an AND gate 44. One input of the AND gate 44 is supplied with a mode-switching signal /SLP directly, and the other input is supplied with the mode-switching signal /SLP through the delay device 42. The delay circuit 40 is configured to delay, by a time period td, the timing of supplying the gate terminal of the transistor N1 with the level of the selection signal SEL to set the transistor N1 in the ON-state, when the memory cell is in a transition from non-selection to selection. A detailed explanation on this feature will be given later.

The potential line SL is also provided with a second additional transistor P1 disposed thereon for selectively bringing the potential line SL into conduction, such that the transistor P1 is in parallel with the first additional transistor N1. The transistor P1 is formed of a PMISFET, and typically a PMOSFET. The gate terminal of the transistor P1 is supplied with a bias potential Vbs through a bias supply line L2, wherein the bias potential Vbs has first and second levels respectively corresponding to non-selection and selection of the memory cell. The second additional transistor P1 is turned on, with reference to the bias potential Vbs, by a voltage drop generated in the memory cell when the first additional transistor N1 is set in the OFF-state. The first level of the bias potential Vbs is a potential between the power supply potential (a first drive potential) VDD and the ground potential (a second drive potential lower than the first drive potential) VSS. The second level of the bias potential Vbs is a potential closer to the ground potential VSS than the first level of the bias potential Vbs is. In this embodiment, the second level of the bias potential Vbs is set at the ground potential VSS.

The bias supply line L2 is provided with a selection circuit 50 including a multiplexer 52 to selectively supply the first and second levels of the bias potential Vbs. One input of the multiplexer 52 is supplied with the output of a bias generator 31 (the first level of the bias potential Vbs), and the other input is supplied with the ground potential VSS (the second level of the bias potential Vbs). The control terminal of the multiplexer 52 is supplied with the mode-switching signal /SLP. Accordingly, the multiplexer 52 is driven by the mode-switching signal /SLP to selectively supply the first and second levels of the bias potential Vbs to the bias supply line L2.

The bias generator 31 is arranged such that the first level of the bias potential Vbs (hereinafter, it is referred to as a bias potential Vbs1) reflects fluctuations in the potential difference between the power supply potential (first drive potential) VDD and ground potential (second drive potential) VSS, and variations (mainly process errors) in the threshold voltage Vth of transistors. In order to carry this out, the bias generator 31 includes a path (i.e. a bias generation circuit) 33, which is supplied with the power supply potential VDD and ground potential VSS at opposite ends, and provided with predetermined devices disposed thereon, as described below. The bias potential Vbs1 is a potential between the power supply potential VDD and ground potential VSS, and is outputted from an output node O1 variably set in position on the path 33.

More specifically, the path 33 is provided with transistors RepLD and RepP1 and a plurality of resistors Rm disposed thereon in series, in this order from the end supplied with the power supply potential VDD. The transistor RepLD and RepP1 are formed of PMISFETs, and typically PMOSFETs. Each of the transistors RepLD and RepP1 is disposed on the path 33 in a diode-connection state in which its gate terminal and drain terminal are connected to each other.

The transistor RepLD is formed of a replica transistor of the load transistor (LD1 or LD2), which is used to constitute the cross-feedback circuit of the memory cell. The transistor RepP1 is formed of a replica transistor of the additional transistor P1 disposed on the potential line SL. Specifically, the transistors RepLD and RepP1 are designed to have the same specifications (size, layout pattern, and so forth) and the same threshold voltage as the transistors LD1 (or LD2) and P1, respectively, (formed in the same process steps).

Figure 7:
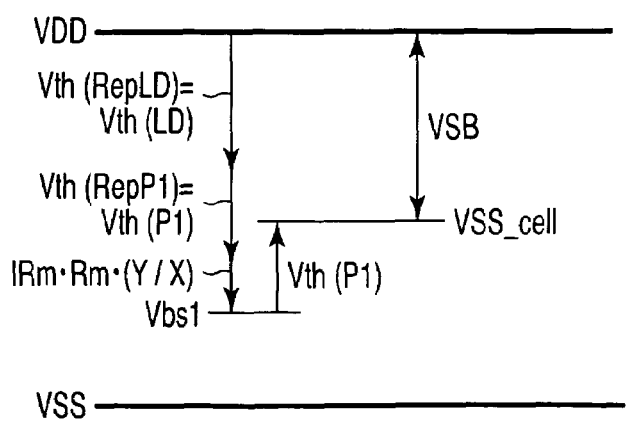
FIG. 7 is a view showing the potential relationship within a memory cell on standby in the device shown in FIG. 6.

Next, for the sake of understanding of the present invention, an explanation will be given of the principle in determining the voltage (standby voltage VSB) applied to a memory cell on standby in the device shown in FIG. 6. FIG. 7 is a view showing the potential relationship within a memory cell on standby in the device shown in FIG. 6. When the memory cell is selected, the ground potential VSS is applied to the node on the lower potential VSS_cell side, through the transistor N1 set in the ON-state. On the other hand, when the memory cell is non-selected and the transistor N1 is set in the OFF-state, the potential level at the node on the lower potential VSS_cell side gradually increases from the VSS due to leakage. When the lower potential VSS_cell increases and exceeds the sum of the bias potential Vbs1 and the threshold voltage Vth(P1) of the transistor P1, the transistor P1 is turned on. As a consequence, the voltage (standby voltage VSB) applied to the memory cell on standby is clamped by this turned-on transistor P1.

More specifically, as described above, the replica transistor RepLD configured in a diode-connection state has the same threshold voltage as the load transistor (LD1 or LD2), (i.e., Vth(RepLD)=Vth(LD)). The replica transistor RepP1 configured in a diode-connection state has the same threshold voltage as the additional transistor P1, (i.e., Vth(RepP1)=Vth(P1)). Furthermore, a predetermined number (Y) of resistors selected from the total number (X) of resistors Rm are interposed between the transistor RepP1 and output node O1.

In this case, the difference between the power supply potential VDD and the potential at the output node O1 becomes a value corresponding to the sum of the threshold voltages Vth(LD) and Vth(P1) plus a margin ($I_{Rm} \times Rm \times (Y/X)$) obtained by resistance division. The $I_{Rm}$ denotes a current flowing through the resistors Rm. Accordingly, the bias potential Vbs1 generated by the path 33 is expressed by the following formula (1).

$$Vbs1 = VDD - Vth(LD) - Vth(P1) - I_{Rm} \times Rm \times (Y/X) \qquad (1)$$

In this formula, the Vth(LD), Vth(P1), and "$I_{Rm} \times Rm \times (Y/X)$" denote the threshold voltage of the transistor LD1 (or LD2), the threshold voltage of the transistor P1, and the margin obtained by resistance division, respectively.

The transistor P1 supplied with the bias potential Vbs1 on the gate terminal is turned on when the lower potential VSS_cell of the memory cell comes to satisfy the following formula (2).

$$VSS\_cell - Vbs1 > Vth(P1) \qquad (2)$$

As a consequence, the level of the lower potential VSS_cell is clamped by the bias potential Vbs1 and threshold voltage Vth(P1), as shown in the following formula (3).

$$VSS\_cell = Vbs1 + Vth(P1) \quad (3)$$

$$= VDD - Vth(LD) - Vth(P1) -$$

$$I_{Rm} \times Rm \times (Y/X) + Vth(P1)$$

Accordingly, the voltage (standby voltage VSB) applied to the memory cell on standby is clamped by a value expressed by the following formula (4).

$$VSB=VDD-VSS\_cell=Vth(LD)+I_{Rm} \times Rm \times (Y/X) \quad (4)$$

The bias potential Vbs1 is set such that the transistor P1 can be turned on before increase in the level of the lower potential VSS_cell (i.e. voltage drop in the memory cell) proceeds to a degree at which the data stored in the memory cell is destroyed. In order to retain the data stored in an SRAM memory cell on standby (WL=L), it is necessary to maintain one of the load transistors LD1 (or LD2) and the other of the driver transistors DV2 (or DV1) in the ON-state. Accordingly, the bias potential Vbs1 is preferably set such that, before either one of the transistors LD1 (or LD2) and DV2 (or DV1) is turned off due to the voltage drop, the transistor P1 is turned on to stop the voltage drop. In addition, even among memory cells forming the same array, there may be a difference in the threshold voltage due to process errors. Accordingly, the margin ($I_{Rm} \times Rm \times (Y/X)$) obtained by resistance division can be set, in consideration of variations in the threshold voltage of the transistors LD1 and LD2.

As described above, in the device shown in FIG. 6, the bias generator 31 is arranged such that the bias potential Vbs1 reflects fluctuations in the potential difference between the power supply potential (first drive potential) VDD and ground potential (second drive potential) VSS, and variations (mainly process errors) in the threshold voltage Vth of transistors. Accordingly, even if fluctuations in the VDD and variations in the threshold voltage Vth occur, the VSS_cell can adapt to allow for them, whereby the standby voltage applied to the memory cell always takes on a proper value. In this case, since there is no need to ensure a sufficient margin, unlike the conventional technique, it is possible to effectively relax the standby voltage, thereby further reducing the standby leakage.

In the arrangement shown in FIG. 6, the bias generator 31 includes only one path (i.e., the first path or bias generation circuit) 33 for the load transistors LD1 and LD2. However, the bias generator 31 may further include, in parallel with the first path, another path (i.e., a second path or bias generation circuit) for the driver transistors DV1 and DV2 arranged in the same concept (U.S. patent application Ser. No. 11/013,429). In this case, the potential line SL is provided with a third additional transistor (PMISFET) P2 (not shown) disposed thereon in parallel with the second additional transistor P1. The gate terminal of the third additional transistor P2 is supplied with a bias voltage generated by the second path.

In such a two-path arrangement, the level of the lower potential VSS_cell is clamped by one of the two P-type transistors P1 and P2, which is turned on at the lower level. Accordingly, the voltage (standby voltage VSB) applied to the memory cell on standby is determined with reference to the bias voltage of one of the paths (one of the bias generation circuits) effective at that time. Typically, the margins ($I_{Rm} \times Rm \times (Y/X)$) obtained by the resistance divisions of the two paths are set to be the same value. In this case, which one of the transistors P1 and P2 is effective to clamp the standby voltage VSB is determined by the magnitude relationship between the threshold voltage of the load transistors LD1 and LD2 and the threshold voltages of the driver transistors DV1 and DV2.

The two-path arrangement allows setting of the standby voltage VSB to more reliably reflect variations (mainly process errors) in the threshold voltage Vth of transistors. This arrangement is adopted on the assumption that the magnitude relationship between the threshold voltages Vth of the load transistors LD1 and LD2 and the driver transistors DV1 and DV2 is not known in advance. However, if the magnitude relationship between the threshold voltages Vth is known in advance, it suffices that only one of the paths is disposed for one of the transistors having the highest threshold voltage Vth.

Figure 8:
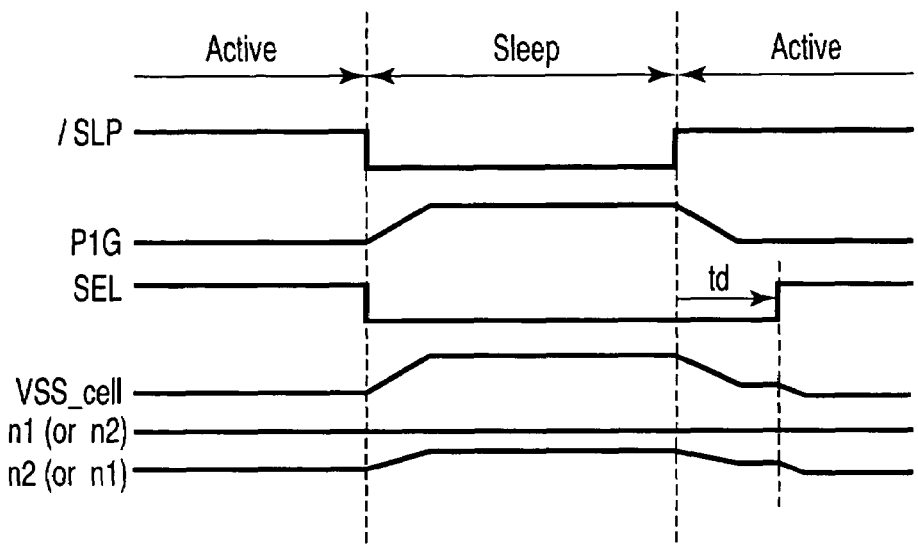
FIG. 8 is a view showing signal waveforms in the device shown in FIG. 6.

Next, an explanation will be given as to why the device shown in FIG. 6 can prevent data stored in a memory cell from being affected by the parasitic capacitance (C3 in FIG. 1) of the PMOS transistor P1 for clamping, and the parasitic capacitances (C1 and C2 in FIG. 1) of the NMOS transistors DV1 and DV2 that form part of the memory cell. FIG. 8 is a view showing signal waveforms in the device shown in FIG. 6. As described above, unlike the device shown in FIG. 1, the device shown in FIG. 6 is arranged such that, in accordance with non-selection and selection of the memory cell, the gate terminal of the transistor P1 for clamping is supplied with the first level (the potential Vbs1 described above) and the second level (ground potential VSS), respectively, of the bias potential Vbs. Further, the gate terminal of the transistor N1 for supplying the ground potential VSS is supplied with the selection signal SEL at delayed timing when the memory cell is in a transition from non-selection to selection.

More specifically, as shown in FIG. 8, when the memory cell is selected (active mode), the mode-switching signal /SLP is set at H-level. During this time, the selection signal SEL supplied to the gate terminal of the transistor N1 takes on H-level to set the transistor N1 in the ON-state, and thus the lower potential VSS_cell becomes L-level (ground potential VSS). On the other hand, during this time, the bias potential Vbs supplied to the gate terminal of the transistor P1 takes on the second level or L-level (ground potential VSS).

When the memory cell is in a transition from selection (active mode) to non-selection (sleep mode), the mode-switching signal /SLP is changed from H-level to L-level, and thus the selection signal SEL is switched from H-level to L-level by the AND gate 44. This signal change is swiftly transmitted to the gate terminal of the transistor N1, and the transistor N1 is thereby turned off. On the other hand, the bias potential Vbs supplied to the gate terminal of the transistor P1 is switched from the second level or L-level (ground potential VSS) to the first level or H-level (the potential Vbs1 described above) by the multiplexer 52. However, at this time, the potential P1G on the gate terminal of the transistor P1 is slowly changed (at a low change rate) from L-level to H-level, as shown in FIG. 8.

This low change rate is designed by factors, such as a low driving ability of the bias generator 31, and a large resistance of the passage connected to the gate terminal of the transistor P1 (typically by a large interconnection length) against the bias potential Vbs. The bias supply line L2 may be deliberately further provided with a resistance device Rd to decrease the change rate, as required. In other words, in any case, the transmission rate of the bias potential Vbs through the bias supply line L2 from the multiplexer 52 to the gate terminal of the transistor P1 is set to be sufficiently lower than the transmission rate of the selection signal SEL through the selection signal supply line L1 from the AND gate 44 to the gate terminal of the transistor N1.

The change rate of the potential P1G on the gate terminal of the transistor P1 is set to be low enough to prevent an overshoot noise from occurring in the gate potential P1G and lower potential VSS_cell. More specifically, it is designed such that, when the memory cell is in a transition from selection to non-selection, the gate potential P1G renders a monotone change from L-level to H-level of the bias potential Vbs, while the lower potential VSS_cell renders a monotone change from the ground potential VSS to the clamp potential. Further, it is designed such that the timing of when the gate potential P1G becomes stable at H-level of the bias potential Vbs essentially agrees with the timing of when the lower potential VSS_cell becomes stable at the clamp potential.

As described previously, when the memory cell is non-selected and the transistor N1 is set in the OFF-state, the level of the lower potential VSS_cell is increased due to a voltage drop generated in the memory cell. At this time, the transistors P1 is turned on, with reference to the potential P1G on the gate terminal (in the steady state, the first level Vbs1 or H-level of the bias potential Vbs applied thereto), by a voltage drop generated in the memory cell. As a consequence, the level of the lower potential VSS_cell is clamped at a value expressed by the sum of the potential P1G of the gate terminal of the transistor P1 and the threshold voltage of the transistor P1.

In this embodiment, when the memory cell is in a transition from selection to non-selection, the potential P1G on the gate terminal of the transistor P1 is not swiftly changed to H-level (first level Vbs1), but slowly changed from L-level to H-level. Accordingly, the level of the lower potential VSS_cell is also slowly changed, while being led by the gate potential P1G. As a consequence, it is possible to prevent an overshoot noise from occurring in the gate potential P1G and lower potential VSS_cell due to the parasitic capacitance (C3 in FIG. 1) of the transistor P1.

On the other hand, when the memory cell is in a transition from non-selection (sleep mode) to selection (active mode), the mode-switching signal /SLP is changed from L-level to H-level, and the bias potential Vbs supplied to the gate terminal of the transistor P1 is switched from the first level or H-level (the potential Vbs1 described above) to the second level or L-level (ground potential VSS) by the multiplexer 52. However, as described above, the potential P1G on the gate terminal of the transistor P1 is slowly changed (at a low change rate) from H-level to L-level, as shown in FIG. 8. On the other hand, the selection signal SEL supplied to the gate terminal of the transistor N1 is maintained at L-level for a while (for the delay time period td) by the delay circuit 40, in spite of the mode-switching signal /SLP having been switched from L-level to H-level.

As described above, when the transistor N1 is in the OFF-state, the level of the lower potential VSS_cell is expressed by the sum of the potential P1G on the gate terminal of the transistor P1 and the threshold voltage of the transistor P1. Accordingly, when the memory cell is in a transition from non-selection to selection, the level of the lower potential VSS_cell is changed along with the gate potential P1G, as long as the selection signal SEL is maintained at L-level by the delay circuit 40, and the transistor N1 is in the OFF-state. In this case, since the gate potential P1G is slowly changed from H-level to L-level, the level of the lower potential VSS_cell is also slowly lowered from the clamp potential, while being led by the gate potential P1G. When the gate potential P1G reaches the second level of the bias potential Vbs or L-level (ground potential VSS), the level of the lower potential VSS_cell becomes a low potential corresponding to the threshold voltage of the transistor P1.

Then, after a lapse of the delay time period td, the selection signal SEL takes on H-level to set the transistor N1 in the ON-state, and thus the level of the lower potential VSS_cell is further discharged from the potential corresponding to the threshold voltage of the transistor P1 to the ground potential VSS. As described above, since the level of VSS_cell is slowly changed, the potential level of each of the internal nodes n1 and n2 of the cell is slowly changed. As a consequence, it is possible to prevent coupling noises from occurring at the nodes n1 and n2 due to the parasitic capacitances (C1 and C2 in FIG. 1) of the NMOS transistors DV1 and DV2 that form part of the memory cell. In order to sufficiently obtain this effect, the timing determined by the delay time period td for the selection signal SEL to take on H-level is preferably set to be later than the timing of when the gate potential P1G reaches the second level of the bias potential Vbs or L-level (ground potential VSS).

SECOND EMBODIMENT

Figure 9:
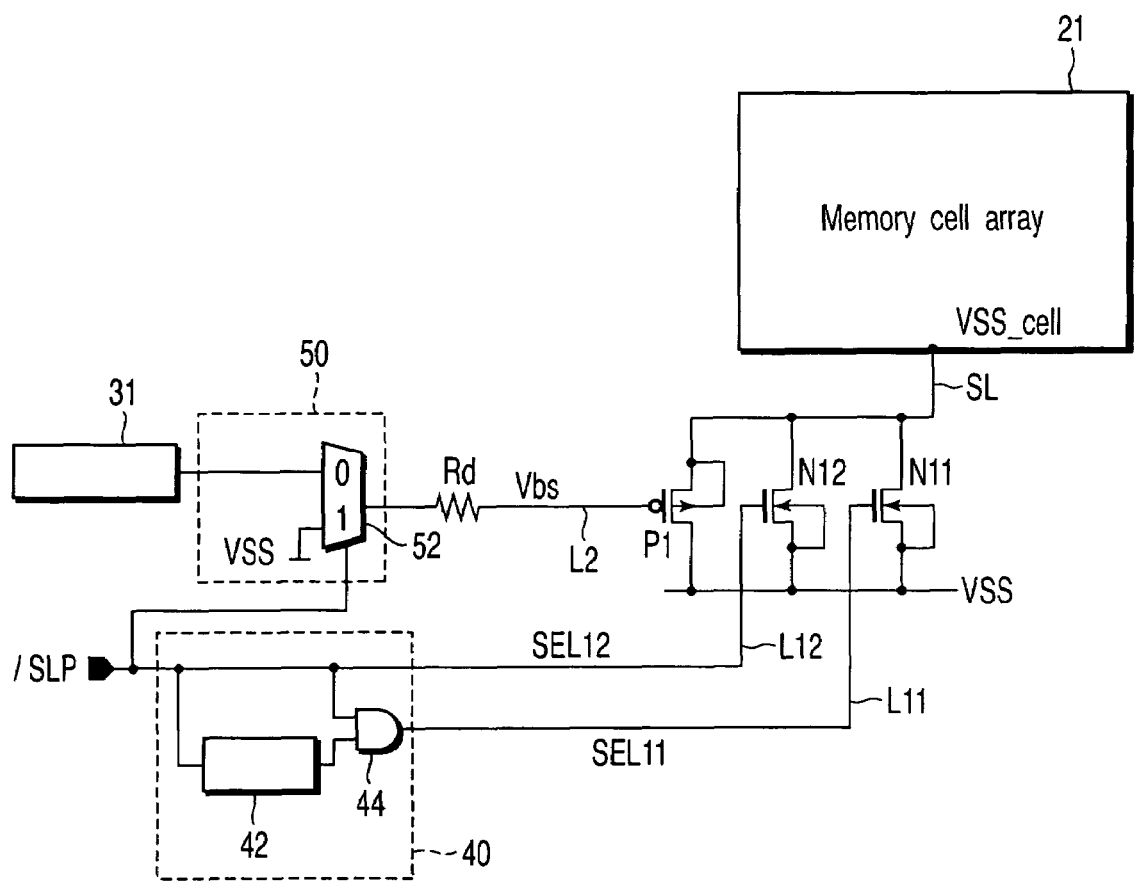
FIG. 9 is a view showing an SRAM (semiconductor storage device) according to a second embodiment of the present invention, focusing on circuitry for clamping the standby voltage thereof.

FIG. 9 is a view showing an SRAM (semiconductor storage device) according to a second embodiment of the present invention, focusing on circuitry for clamping the standby voltage thereof. In the device shown in FIG. 9, a potential line SL connected to a ground potential VSS is provided with two transistors N11 and N12 disposed thereon in parallel with each other, in place of the first additional transistor N1 shown in FIG. 6. Except for the matters relating to the two transistors N11 and N12, the device shown in FIG. 9 has the same structure as the device shown in FIG. 6.

More specifically, the transistors N11 and N12 are formed of NMISFETs, and typically NMOSFETs. The transistors N12 is set to have a smaller current driving ability than the transistor N11. The gate terminals of the transistors N11 and N12 are supplied with selection signals SEL11 and SEL12 through selection signal supply lines L11 and L12, respectively, to set the transistors N11 and N12 in the ON-state when the memory cell is selected. Specifically, in summary, the transistors N11 and N12 are set in the ON-state when the memory cell is selected, and they are set in the OFF-state when the memory cell is non-selected. When the memory cell is selected, the ground potential VSS is applied to the node on the lower potential VSS_cell side, through the transistors N11 and N12 set in the ON-state.

The selection signal supply line L11 is provided with a delay circuit 40 including a delay device 42 and an AND gate 44. One input of the AND gate 44 is supplied with a mode-switching signal /SLP directly, and the other input is supplied with the mode-switching signal /SLP through the delay device 42. The delay circuit 40 is configured to delay, by a time period td, the timing of supplying the gate terminal of the transistor N11 with the level of a selection signal SEL11 to set the transistor N11 in the ON-state, when the memory cell is in a transition from non-selection to selection. On the other hand, the selection signal supply line L12 is supplied with the mode-switching signal /SLP directly as a selection signal SEL12, not through the delay circuit 40.

Figure 10:
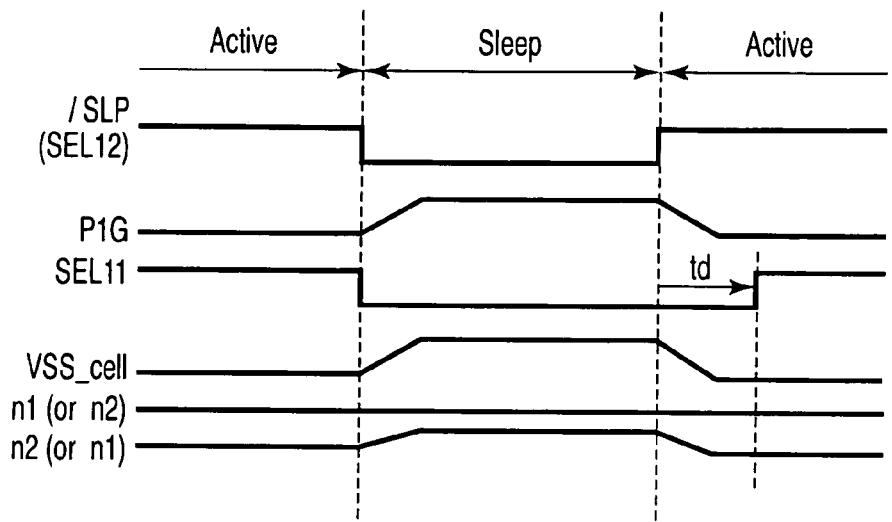
FIG. 10 is a view showing signal waveforms in the device shown in FIG. 9.

FIG. 10 is a view showing signal waveforms in the device shown in FIG. 9. In the device shown in FIG. 9, when the memory cell is in a transition from selection (active mode)

to non-selection (sleep mode), it is possible to prevent an overshoot noise from occurring in the gate potential P1G and lower potential VSS_cell due to the parasitic capacitance (C3 in FIG. 1) of the transistor P1, in the same manner as the device shown in FIG. 6. On the other hand, when the memory cell is in a transition from non-selection to selection, it is possible to prevent coupling noises from occurring at the internal nodes n1 and n2 of the cell due to the parasitic capacitances (C1 and C2 in FIG. 1) of the NMOS transistors DV1 and DV2 that form part of the memory cell, in a more effective manner than the device shown in FIG. 6.

Specifically, in the device shown in FIG. 6 according to the first embodiment, when the memory cell is in a transition from selection to non-selection, the level of the lower potential VSS_cell is slowly lowered to a potential corresponding to the threshold voltage of the transistor P1, while being led by the gate potential P1G. However, the selection signal SEL then becomes H-level to set the transistor N1 in the ON-state, and the level of the lower potential VSS_cell is thereby further lowered to the ground potential VSS at a relatively high change rate. Where the threshold voltage of the transistor P1 is large (i.e., the level change range of the lower potential VSS_cell in the last stage is large), a coupling noise generated by this relatively high change rate is not negligible.

In this respect, in the device shown in FIG. 9 according to the second embodiment, when the memory cell is in a transition from non-selection (sleep mode) to selection (active mode), the mode-switching signal /SLP becomes H-level, and only the transistor N12 having a smaller current driving ability is first turned on. At this time, although the level of the lower potential VSS_cell is lowered together with decrease in the gate potential P1G, it is not clamped at a potential corresponding to the threshold voltage of the transistor P1, but is kept lowered to L-level (ground potential VSS), because the transistor N12 is in the ON-state. Thereafter, the transistor N11 having a larger current driving ability is also turned on, but there is substantially no change in the level of the lower potential VSS_cell any more at this time. As a consequence, it is possible to prevent coupling noises from occurring at the internal nodes n1 and n2 of the cell.

THIRD EMBODIMENT

Figure 11:
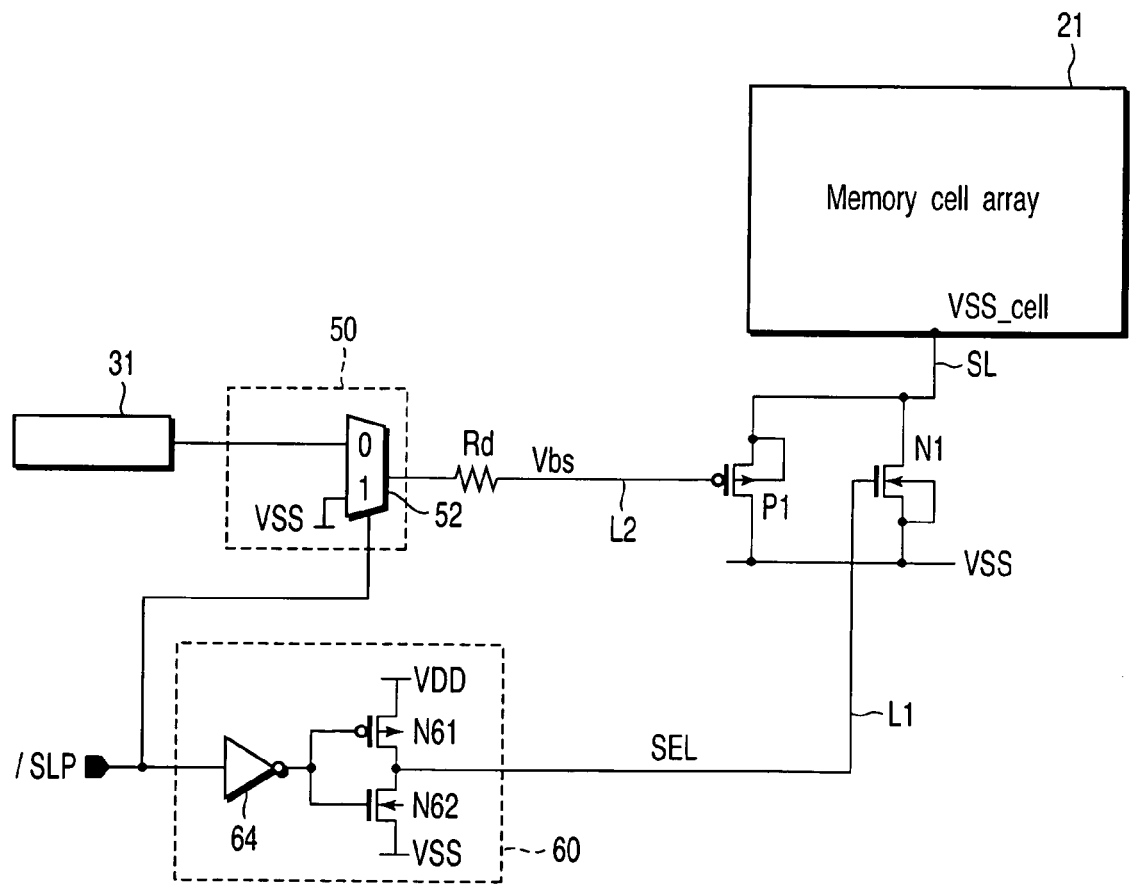
FIG. 11 is a view showing an SRAM (semiconductor storage device) according to a third embodiment of the present invention, focusing on circuitry for clamping the standby voltage thereof.

FIG. 11 is a view showing an SRAM (semiconductor storage device) according to a third embodiment of the present invention, focusing on circuitry for clamping the standby voltage thereof. In the device shown in FIG. 11, a selection signal supply line L1 connected to the gate terminal of a transistor N1 is provided with an inverter circuit 60 disposed thereon, in place of the delay circuit 40 shown in FIG. 6. Except for the matters relating to the inverter circuit 60, the device shown in FIG. 11 has the same structure as the device shown in FIG. 6. Although the effects of the device shown in FIG. 11 are similar to those of the device shown in FIG. 9, the device shown in FIG. 11 can attain the same effect with a simpler circuit.

More specifically, the inverter circuit 60 includes a NOT gate 64, and a pull-up transistor N61 and a pull-down transistor N62 connected to the power supply potential VDD and the ground potential VSS, respectively. The transistors N61 and N62 are formed of NMISFETs, and typically NMOSFETs. The pull-up transistor N61 is set to have a smaller current driving ability than the pull-down transistor N62. As a consequence, the transistor N1 is operated such that the switching from the OFF-state to the ON-stat is slower than the switching from the ON-state to the OFF-state.

FIG. 12 is a view showing signal waveforms in the device shown in FIG. 11. In the device shown in FIG. 11, when the memory cell is in a transition from selection (active mode) to non-selection (sleep mode), since the pull-down transistor N62 has a larger current driving ability, the potential on the gate terminal of the transistor N1 is swiftly changed to L-level of the selection signal SEL. On the other hand, the potential P1G on the gate terminal of the transistor P1 is slowly changed from L-level to H-level, as described previously. As a consequence, also in the device shown in FIG. 11, it is possible to prevent an overshoot noise from occurring in the gate potential P1G and lower potential VSS_cell due to the parasitic capacitance (C3 in FIG. 1) of the transistor P1, in essentially the same manner as the device shown in FIG. 6.

On the other hand, when the memory cell is in a transition from non-selection to selection, since the pull-up transistor N61 has a smaller current driving ability, the selection signal SEL is slowly changed to H-level. At this time, although the level of the lower potential VSS_cell is lowered together with decrease in the gate potential P1G, it is not clamped at a potential corresponding to the threshold voltage of the transistor P1, but is kept lowered to L-level (ground potential VSS), because the transistor N1 is in a weak ON-state. Thereafter, the selection signal SEL becomes H-level to set the transistor N1 in the complete ON-state, but there is substantially no change in the level of the lower potential VSS_cell any more at this time. As a consequence, it is possible to prevent coupling noises from occurring at the internal nodes n1 and n2 of the cell.

FOURTH EMBODIMENT

FIG. 13 is a view showing an SRAM (semiconductor storage device) according to a fourth embodiment of the present invention, focusing on circuitry for clamping the standby voltage thereof. In the first to third embodiments, the level of the lower potential VSS_cell of a memory cell is controlled to clamp the standby voltage thereof (i.e., to reduce the standby leakage). However, the level of the higher potential VDD_cell may be controlled in accordance with the same concept. The SRAM shown in FIG. 13 is configured on the basis of such an aspect. The memory cell array 21 and memory cell 24 of this SRAM have the same structures as those shown in FIGS. 4 and 5.

As shown in FIG. 13, a potential line DL connected to the power supply potential VDD is provided with a first additional transistor P21 disposed thereon for selectively bringing the potential line DL into conduction. The transistor P21 is formed of a PMISFET, and typically a PMOSFET. The gate terminal of the transistor P21 is supplied with a selection signal SEL21 through a selection signal supply line L21 to set the transistor P21 in the ON-state when the memory cell is selected. Specifically, in summary, the transistor P21 is set in the ON-state when the memory cell is selected, and it is set in the OFF-state when the memory cell is non-selected. When the memory cell is selected, the power supply potential VDD is applied to a node on the higher potential VDD_cell side, through the transistor P21 set in the ON-state.

The selection signal supply line L21 is provided with a delay circuit 140 including a delay device 142 and an OR gate 144. One input of the OR gate 144 is supplied with a mode-switching signal SLP directly, and the other input is supplied with the mode-switching signal SLP through the delay device 142. The delay circuit 140 is configured to delay the timing of supplying the gate terminal of the transistor P21 with the level of the selection signal SEL21 to set the transistor P21 in the ON-state, when the memory cell is in a transition from non-selection to selection. The detailed operation of the device for this feature is essentially the same as that of the device shown in FIG. 6 according to the first embodiment.

The potential line DL is also provided with a second additional transistor N21 disposed thereon for selectively bringing the potential line DL into conduction, such that the transistor N21 is in parallel with the first additional transistor P21. The transistor N21 is formed of an NMISFET, and typically an NMOSFET. The gate terminal of the transistor N21 is supplied with a bias potential Vbsx through a bias supply line L22, wherein the bias potential Vbsx has first and second levels respectively corresponding to non-selection and selection of the memory cell. The second additional transistor N21 is turned on, with reference to the bias potential Vbsx, by a voltage drop generated in the memory cell when the first additional transistor P21 is set in the OFF-state. The first level of the bias potential Vbsx is a potential between the power supply potential (a first drive potential) VDD and the ground potential (a second drive potential lower than the first drive potential) VSS. The second level of the bias potential Vbsx is a potential closer to the power supply potential VDD than the first level of the bias potential Vbsx is. In this embodiment, the second level of the bias potential Vbsx is set at the power supply potential VDD.

The bias supply line L22 is provided with a selection circuit 150 including a multiplexer 152 to selectively supply the first and second levels of the bias potential Vbsx. One input of the multiplexer 152 is supplied with the output of a bias generator 131 (the first level of the bias potential Vbsx), and the other input is supplied with the power supply potential VDD (the second level of the bias potential Vbsx). The control terminal of the multiplexer 152 is supplied with the mode-switching signal SLP. Accordingly, the multiplexer 152 is driven by the mode-switching signal SLP to selectively supply the first and second levels of the bias potential Vbsx to the bias supply line L22.

Also in the device shown in FIG. 13, when the memory cell is in a transition from selection to non-selection, it is possible to prevent an overshoot noise from occurring in the potential on the gate terminal of the transistor N21 and the higher potential VDD_cell due to the parasitic capacitance of the transistor N21, in the same manner as the device shown in FIG. 6 (although the polarities are reversed). On the other hand, when the memory cell is in a transition from non-selection to selection, it is possible to prevent coupling noises from occurring at the internal nodes n1 and n2 of the cell due to the parasitic capacitances of the PMOS transistors LD1 and LD2 that form part of the memory cell, in the same manner as the device shown in FIG. 6 (although the polarities are reversed).

Matters Common to the First to Fourth Embodiments

In the embodiment described above, each memory cell 24 of the SRAM is formed of six transistors, as shown in FIG. 5. However, the ideas included in these embodiments may be similarly applied to an SRAM of another type, such as an SRAM in which each memory cell is formed of four transistors and two resistors substituting two load transistors. The bias generator 31 is arranged such that the first level of the bias potential Vbs reflects fluctuations in the potential difference between the power supply potential (first drive potential) VDD and ground potential (second drive potential) VSS, and variations (mainly process errors) in the threshold voltage Vth of transistors. However, the ideas included in these embodiments may be similarly applied to a device which has a bias generator arranged not to reflect these fluctuations or variations.

According to the first to fourth embodiments, it is possible to provide a semiconductor storage device of the SRAM type which can effectively relax the voltage applied to a memory cell on standby (standby voltage), thereby reducing the standby leakage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor storage device comprising:
   a memory cell array including a plurality of memory cells arrayed therein;
   a plurality of word lines configured to select the memory cells;
   a plurality of data lines configured to transmit data into and from the memory cells;
   a first potential line configured to supply a first drive potential to each of the memory cells;
   a second potential line configured to supply a second drive potential lower than the first drive potential to each of the memory cells;
   a first additional FET (FET: Field-Effect Transistor) disposed on one potential line of the first and second potential lines, to selectively bring the one potential line into conduction;
   a selection signal supply line configured to supply a selection signal to a gate terminal of the first additional FET, so as to set the first additional FET in an ON-state, when each of the memory cells is selected;
   a second additional FET disposed on the one potential line, in parallel with the first additional FET, to selectively bring the one potential line into conduction; and
   a bias supply line configured to supply a gate terminal of the second additional FET with a bias potential that has first and second levels respectively corresponding to non-selection and selection of each of the memory cells, wherein the second additional FET is turned on, with reference to the bias potential, by a voltage drop generated in the memory cell, and wherein the first level of the bias potential is a potential between the first and second drive potentials, and the second level of the bias potential is closer to one potential of the first and second drive potentials corresponding to the one potential line, than the first level is,
   wherein the first level of the bias potential is arranged such that the second additional FET is turned on before the voltage drop proceeds to a degree at which data stored in the memory cell is destroyed.

2. The semiconductor storage device according to claim 1, wherein the second level of the bias potential is one potential of the first and second drive potentials corresponding to the one potential line.

3. The semiconductor storage device according to claim 1, further comprising a selection circuit configured to be driven by a mode-switching signal that switches non-selection and selection of the memory cell, so as to selectively supply the bias supply line with the first and second levels of the bias potential.

4. The semiconductor storage device according to claim 3, further comprising a bias generation circuit configured to generate the first level of the bias potential and supply the first level to one input of the selection circuit.

5. The semiconductor storage device according to claim 4, wherein the bias generation circuit is configured to generate the first level of the bias potential to reflect one or both of fluctuations in a potential difference between the first and second drive potentials, and variations in threshold voltage of FETs that form part of the memory cell.

6. The semiconductor storage device according to claim 1, wherein a transmission rate of the bias potential through the bias supply line is lower than a transmission rate of the selection signal through the selection signal supply line.

7. The semiconductor storage device according to claim 1, wherein, when the memory cell is in a transition from selection to non-selection, the gate terminal of the second additional FET is changed from the second level to the first level of the bias potential at a predetermined rate, which is set to be low enough to prevent an overshoot noise from occurring in a potential on the gate terminal of the second additional FET and a potential on a connection node between the one potential line and the memory cell.

8. The semiconductor storage device according to claim 7, wherein, when the memory cell is in a transition from selection to non-selection, the gate terminal of the second additional FET renders a monotone change from the second level to the first level of the bias potential, while the one potential line renders a monotone change from a corresponding potential of the first and second drive potentials to a clamp potential, such that timing of when the gate terminal of the second additional FET becomes stable at the first level of the bias potential essentially agrees with timing of when the connection node becomes stable at the clamp potential.

9. The semiconductor storage device according to claim 7, wherein the predetermined rate is set by a factor that includes one or both of driving ability of a circuit configured to generate the first level of the bias potential, and resistance of a passage connected to the gate terminal of the second additional FET against the bias potential.

10. The semiconductor storage device according to claim 1, further comprising a delay circuit connected to the selection signal supply line, and configured to delay timing of supplying the gate terminal of the first additional FET with a level of the selection signal to set the first additional FET in an ON-state, when the memory cell is in a transition from non-selection to selection.

11. The semiconductor storage device according to claim 10, wherein the delay circuit is configured to start supplying the gate terminal of the first additional FET with a level of the selection signal to set the first additional FET in an ON-state, after the gate terminal of the second additional FET reaches the second level of the bias potential, when the memory cell is in a transition from non-selection to selection.

12. The semiconductor storage device according to claim 10, further comprising:
a third additional FET disposed on the one potential line, in parallel with the first additional FET, to selectively bring the one potential line into conduction, the third additional FET having a current driving ability smaller than that of the first additional FET; and p1 a selection signal supply line configured to supply a selection signal to a gate terminal of the third additional FET not through the delay circuit, so as to set the third additional FET in an ON-state, when the memory cell is selected.

13. The semiconductor storage device according to claim 1, further comprising an inverter circuit connected to the selection signal supply line, wherein the inverter circuit comprises a pull-up FET and a pull-down FET different in current driving ability such that the second additional FET is switched from an OFF-state to an ON-state slower than from the ON-state to the OFF-state.

14. The semiconductor storage device according to claim 13, wherein the inverter circuit is configured such that the gate terminal of the first additional FET reaches a potential corresponding to the selection signal, after the gate terminal of the second additional FET reaches the second level of the bias potential, when the memory cell is in a transition from non-selection to selection.

15. The semiconductor storage device according to claim 1, wherein the plurality of memory cells are respectively formed of SRAM (SRAM: Static Random Access Memory) memory cells.

16. The semiconductor storage device according to claim 1, wherein the one potential line is the second potential line, and the first and second additional FETs are respectively formed of an NMOSFET (MOS: Metal-Oxide-Semiconductor) and a PMOSFET.

17. The semiconductor storage device according to claim 1, wherein the one potential line is the first potential line, and the first and second additional FETs are respectively formed of a PMOSFET (MOS: Metal-Oxide-Semiconductor) and an NMOSFET.

18. A semiconductor storage device comprising:
a memory cell array including a plurality of memory cells arrayed therein, each of the memory cells having first to fourth NMISFETs (MIS: Metal-Insulator-Semiconductor) and first and second PMISFETs, such that a drain terminal of the first NMISFET is connected to a drain terminal of the first PMISFET, a drain terminal of the second NMISFET is connected to a drain terminal of the second PMISFET, gate terminals of the first NMISFET and the first PMISFET are connected to the drain terminals of the second NMISFET and the second PMISFET and a source terminal of the third NMISFET, and gate terminals of the second NMISFET and the second PMISFET are connected to the drain terminals of the first NMISFET and the first PMISFET and a source terminal of the fourth NMISFET;
a plurality of word lines configured to select the memory cells, each of the word lines being connected to gate terminals of the third NMISFET and the fourth NMISFET;
a plurality of data lines configured to transmit data into and from the memory cells, two of the data lines being respectively connected to drain terminals of the third NMISFET and the fourth NMISFET;
a first potential line connecting source terminals of the first PMISFET and the second PMISFET to a supply source of a first drive potential;
a second potential line connecting source terminals of the first NMISFET and the second NMISFET to a supply source of a second drive potential lower than the first drive potential;
a fifth NMISFET disposed on the second potential line to selectively bring the second potential line into conduction;
a selection signal supply line configured to supply a selection signal to a gate terminal of the fifth NMIS- FET, so as to set the fifth NMISFET in an ON-state, when each of the memory cells is selected;

a third PMISFET disposed on the second potential line, in parallel with the fifth NMISFET, to selectively bring the second potential line into conduction;

a bias supply line configured to supply a gate terminal of the third PMISFET with a bias potential that has first and second levels respectively corresponding to non-selection and selection of each of the memory cells, wherein the first level of the bias potential is a potential between the first and second drive potentials, and the second level of the bias potential is the second drive potential;

a selection circuit configured to be driven by a mode-switching signal that switches non-selection and selection of each of the memory cells, so as to selectively supply the bias supply line with the first and second levels of the bias potential; and a bias generation circuit configured to generate the first level of the bias potential and supply the first level to one input of the selection circuit.

19. A semiconductor storage device comprising:

a memory cell array including a plurality of memory cells arrayed therein, each of the memory cells having first to fourth NMISFETs (MIS: Metal-Insulator-Semiconductor) and first and second PMISFETS, such that a drain terminal of the first NMISFET is connected to a drain terminal of the first PMISFET, a drain terminal of the second NMISFET is connected to a drain terminal of the second PMISFET, gate terminals of the first NMISFET and the first PMISFET are connected to the drain terminals of the second NMISFET and the second PMISFET and a source terminal of the third NMISFET, and gate terminals of the second NMISFET and the second PMISFET are connected to the drain terminals of the first NMISFET and the first PMISFET and a source terminal of the fourth NMISFET;

a plurality of word lines configured to select the memory cells, each of the word lines being connected to gate terminals of the third NMISFET and the fourth NMISFET;

a plurality of data lines configured to transmit data into and from the memory cells, two of the data lines being respectively connected to drain terminals of the third NMISFET and the fourth NMISFET;

a first potential line connecting source terminals of the first PMISFET and the second PMISFET to a supply source of a first drive potential;

a second potential line connecting source terminals of the first NMISFET and the second NMISFET to a supply source of a second drive potential lower than the first drive potential;

a third PMISFET disposed on the first potential line to selectively bring the first potential line into conduction;

a selection signal supply line configured to supply a selection signal to a gate terminal of the third PMISFET, so as to set the third PMISFET in an ON-state, when each of the memory cells is selected;

a fifth NMISFET disposed on the first potential line, in parallel with the third PMISFET, to selectively bring the first potential line into conduction;

a bias supply line configured to supply a gate terminal of the fifth NMISFET with a bias potential that has first and second levels respectively corresponding to non-selection and selection of each of the memory cells, wherein the first level of the bias potential is a potential between the first and second drive potentials, and the second level of the bias potential is the first drive potential;

a selection circuit configured to be driven by a mode-switching signal that switches non-selection and selection of each of the memory cells, so as to selectively supply the bias supply line with the first and second levels of the bias potential; and a bias generation circuit configured to generate the first level of the bias potential and supply the first level to one input of the selection circuit.

* * * * *